(12) United States Patent
Terao et al.

(10) Patent No.: US 9,796,018 B2
(45) Date of Patent: Oct. 24, 2017

(54) SILVER POWDER

(71) Applicant: SUMITOMO METAL MINING CO., LTD., Tokyo (JP)

(72) Inventors: Toshiaki Terao, Ehime (JP); Yuji Kawakami, Ehime (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 248 days.

(21) Appl. No.: 14/650,348

(22) PCT Filed: Oct. 2, 2013

(86) PCT No.: PCT/JP2013/076815
§ 371 (c)(1),
(2) Date: Jun. 8, 2015

(87) PCT Pub. No.: WO2014/087727
PCT Pub. Date: Jun. 12, 2014

(65) Prior Publication Data
US 2015/0314371 A1    Nov. 5, 2015

(30) Foreign Application Priority Data

Dec. 7, 2012 (JP) ................................ 2012-267825
Mar. 6, 2013 (JP) ................................ 2013-044321

(51) Int. Cl.
*B22F 1/00* (2006.01)
*C22C 5/06* (2006.01)
(Continued)

(52) U.S. Cl.
CPC .......... *B22F 1/0011* (2013.01); *C09D 17/006* (2013.01); *C22C 5/06* (2013.01);
(Continued)

(58) Field of Classification Search
None
See application file for complete search history.

(56) References Cited

U.S. PATENT DOCUMENTS

2005/0172483 A1*  8/2005  Sugita ...................... H01B 1/22
                                                29/830
2007/0164260 A1*  7/2007  Kuwajima ............... H01B 1/02
                                                252/512

(Continued)

FOREIGN PATENT DOCUMENTS

JP       2000-129318 A      5/2000
JP       2004-197030 A      7/2004
(Continued)

OTHER PUBLICATIONS

Nov. 5, 2013 International Search Report issued in Application No. PCT/JP2013/076815.

*Primary Examiner* — Devang R Patel
(74) *Attorney, Agent, or Firm* — Oliff PLC

(57) ABSTRACT

Provided is a silver powder which has an appropriate viscosity range at the time of paste production, can be easily kneaded, and prevents the occurrence of flakes. The silver powder to be used has a specific surface area ratio $SA_B/SA_S$ of 0.5 to 0.9, wherein $SA_B$ is a specific surface area measured by the BET method, and $SA_S$ is a specific surface area calculated from a mean primary-particle diameter $D_S$ measured with a scanning electron microscope. Furthermore, the silver powder preferably has a degree of aggregation of 1.5 to 5.0, the degree being obtained in such a manner that a volume median diameter $D_{50}$ measured by laser diffraction scattering is divided by the foregoing Ds.

6 Claims, 1 Drawing Sheet

(A)

(B)

(C)

(51) Int. Cl.
*C09D 17/00* (2006.01)
*H01B 1/02* (2006.01)
*H01B 1/22* (2006.01)
*H05K 1/09* (2006.01)

(52) U.S. Cl.
CPC ............... *H01B 1/02* (2013.01); *H01B 1/22* (2013.01); *H05K 1/092* (2013.01); *H05K 2201/0266* (2013.01)

(56) References Cited

U.S. PATENT DOCUMENTS

2009/0233237 A1* 9/2009 Yoshiki ............... H05K 3/106
 430/311
2014/0306167 A1* 10/2014 Terao ..................... H01B 1/02
 252/514

FOREIGN PATENT DOCUMENTS

| JP | 2004-265607 A | 9/2004 |
| JP | 2010-053409 A | 3/2010 |
| JP | 2011-001581 A | 1/2011 |
| JP | 2013-096008 A | 5/2013 |
| WO | 2012/169628 A1 | 12/2012 |

* cited by examiner

SILVER POWDER

FIELD OF THE INVENTION

The present invention relates to a silver powder, more specifically, relates to a silver powder serving as a main component of a silver paste used for forming a wiring layer, an electrode, and the like of an electronic apparatus. The present application claims priority based on Japanese Patent Application No. 2012-267825 filed in Japan on Dec. 7, 2012, and Japanese Patent Application No. 2013-044321 filed in Japan on Mar. 6, 2013. The total contents of the patent application are to be incorporated by reference into the present application.

BACKGROUND ART

To form a wiring layer, an electrode, and the like of an electronic apparatus, silver pastes, such as a resin type silver paste and a baked type silver paste, have been widely used. In other words, these silver pastes are applied to or printed on various kinds of substrates, and then heat-cured or heat-baked, whereby a conductive film to serve as a wiring layer, an electrode, or the like can be formed.

For example, the resin type silver paste comprises a silver powder, a resin, a curing agent, a solvent, and the like, and is printed on a conductor circuit pattern or on a terminal, and heat-cured at a temperature of 100° C. to 200° C. to be made into a conductive film, whereby wiring or an electrode is formed. On the other hand, the baked type silver paste comprises a silver powder, glass, a solvent, and the like, and is printed on a conductor circuit pattern or on a terminal, and heat-baked at a temperature of 600° C. to 800° C. to be made into a conductive film, whereby wiring or an electrode is formed. In the wiring and the electrodes formed of these silver pastes, an electric current path in which an electrical connection is established by linkages between the silver powders is formed.

The silver powder to be used for the silver paste has a particle diameter of 0.1 µm to a few µm, and the particle diameter of the silver powder to be used differs depending on the thickness of a wiring or an electrode to be formed. Furthermore, uniform dispersion of the silver powder in the paste enables the formation of wiring having a uniform thickness or the formation of an electrode having a uniform thickness.

Generally, a silver paste is produced in such a manner that, for example, first, a silver powder is preliminarily kneaded smoothly with other components such as a solvent, and then kneaded with a predetermined pressure being applied using a three-roll mill or the like. This manner enables a large amount of a silver paste to be produced at a time, whereby higher productivity and an effect of production cost reduction can be expected. Meanwhile, a silver powder is required to be efficiently kneaded by a roller, in other words, required to have good kneadability.

A paste having a too high or too low viscosity is difficult to efficiently knead by a three-roll mill. A silver powder having a low viscosity causes a shear stress in a three-roll mill to be smaller and causes a shear force applied to a silver paste to be smaller, and accordingly the silver powder is insufficiently dispersed in the paste. On the other hand, a silver powder having a high viscosity is difficult to knead smoothly with other components such as a solvent, and consequently, a paste obtained by insufficiently kneading the silver powder with other components such as a solvent is fed into a three-roll mill.

In the case where a silver powder is insufficiently dispersed in a paste, or in the case where the viscosity of a paste is decreased due to insufficient kneading of a silver powder with other components such as a solvent, aggregate masses of silver particles are present in the paste. When this paste is kneaded by a three-roll mill, the aggregate masses of the silver particles are crushed, whereby a coarse powder such as a powder in the form of a thin piece having a few mm size (flakes) is generated. It is not desirable to leave the generated flakes in the paste as they are, and therefore the flakes are sieved using a mesh or the like and removed. However, too much amount of flakes generated cause troubles such as clogging of the mesh with the coarse powder, whereby the flakes cannot be efficiently removed, and productivity is considerably reduced.

Furthermore, in the case where flakes occur in a paste as mentioned above, when screen-printing is conducted using that paste, a fine screen is clogged up with the coarse flakes, thereby causing difficulties in accurate printing of a pattern.

Thus, the flake occurrence at the time of paste production has a great impact on printability in screen-printing. Therefore, it is desired that a silver powder provides a viscosity enough to be easily kneaded at the time of paste production and has good dispersibility in a solvent, and furthermore, does not cause aggregate masses of silver particles to be formed during the kneading.

To make paste production easier, the control of the particle size distribution of a silver powder and the form thereof has been proposed. For example, Patent Literature 1 proposes a conductive adhesive agent in which 30% to 98% by weight of a silver powder as a conductive powder is blended with a resin for a binder, wherein not less than 30% by weight of a silver powder whose primary particles have a flat shape and which has a massive aggregation structure having a tap density of not more than 1.5 g/cm$^3$ is contained.

According to this proposal, the silver powder having the aggregation structure has high dispersibility enough to be easily released from aggregation and changed into primary particles, and, without causing the deterioration of conductivity due to poor dispersion of the silver powder, stable electrical conductivity can be generated, and there can be obtained a conductive adhesive agent which realizes a curing material excellent in not only conductivity but also adhesiveness, heat resistance, moisture resistance, workability, and thermal conductivity.

However, this proposal does not consider the occurrence of coarse flakes caused by a change in the viscosity of a paste or re-aggregation of silver particles dispersed in the paste, and hence it is difficult to say that the dispersibility in a finally-obtained paste is secured.

Furthermore, Patent Literature 2 proposes a method for producing a silver powder, wherein a nonionic surface active agent having an HLB value of 6 to 17 is added to a silver-complex-containing solution, and, at the time when a reducing agent is added thereto, the addition rate of a solution containing a reducing agent is made higher, that is, not less than 1 equivalent per minute in order to prevent the aggregation of reduced silver particles, whereby there is obtained a silver powder having a tap density of not less than 2.5 g/cm$^3$, a mean particle diameter of 1 to 6 µm, and a specific surface area of not more than 5 m$^2$/g, and being excellent in dispersibility.

However, this proposal is to prevent the aggregation of an obtained silver powder, thereby achieving a dispersed silver powder, but, does not consider the dispersibility of a silver powder in a solvent and the occurrence of flakes at the time of paste production.

Furthermore, Patent Literature 3 proposes a conductive paste, comprising: a binder containing a thermosetting resin as a main component; and conductive particles having a mean particle diameter of 0.5 to 20 μm and a specific surface area of 0.07 to 1.7 m²/g and having at least two peaks in a particle size distribution thereof, or conductive particles having a mean particle diameter of 0.5 to 20 μm and a specific surface area of 0.07 to 1.7 m²/g and formed of the mixture of conductive particles having at least two different particle size distributions. According to this proposal, a conductive paste having good flowability and dispersibility is obtained, conductive particles are stably filled in a via and stably come in contact with each other inside the via hole, and high-quality via hole conductors can be stably formed with less variation.

However, this proposal aims at the filling property of the paste into a via and high connection-reliability, and does not consider the dispersibility of a silver powder itself in a solvent and the occurrence of flakes at the time of paste production.

As mentioned above, there have been proposed improvements in the dispersibility of a silver powder in a paste and the conductivity and reliability of an electrode and wiring which are formed using the paste, but, the prevention of flake occurrence at the time of paste production has not been proposed.

PRIOR-ART DOCUMENTS

Patent Documents

Patent document 1: Japanese Patent Application Laid-Open No. 2004-197030
Patent document 2: Japanese Patent Application Laid-Open No. 2000-129318
Patent document 3: Japanese Patent Application Laid-Open No. 2004-265607

SUMMARY OF THE INVENTION

Problems to be Solved by the Invention

In view of such conventional actual circumstances, an object of the present invention is to provide a silver powder which has an appropriate viscosity range at the time of paste production, can be easily kneaded, and prevents the occurrence of flakes.

Means to Solve the Problem

To achieve the foregoing object, the present inventors earnestly made a study and consequently found that, when silver particles form aggregates having an appropriate strength, the silver particles have an appropriate viscosity range at the time when the silver particles are kneaded with a paste component. Furthermore, the present inventors found that such silver powder can be easily kneaded at the time of paste production, and prevent a viscosity change and improve the kneadability, and thus, the inventors accomplished the present invention.

That is, a silver powder of the present invention is characterized by having a specific surface area ratio $SA_B/SA_S$ of 0.5 to 0.9, wherein $SA_B$ is a specific surface area measured by the BET method, and $SA_S$ is a specific surface area calculated from a mean primary-particle diameter $D_S$ measured with a scanning electron microscope.

The foregoing silver powder preferably has a degree of aggregation of 1.5 to 5.0, the degree being obtained in such a manner that a volume median diameter $D_{50}$ measured by laser diffraction scattering is divided by the foregoing Ds, and the silver powder preferably has the degree of aggregation of 1.5 to 3.5 after application of a load of 100 N/cm².

Furthermore, the silver powder preferably has a compressibility of not less than 20% obtained by application of a load of 34 N/cm² in the measurement of the shear stress of a powder bed and has a compressibility of not more than 40% obtained by application of a load of 113 N/cm².

The silver powder preferably has a ratio $D_2/D_1$ of from 0.5 to 1.5, wherein $D_1$ is a volume median diameter obtained in such a manner that the silver powder in a paste obtained by kneading of said silver powder with an epoxy resin at a centrifugal force of 420 G is measured by laser diffraction scattering; and $D_2$ is a volume median diameter obtained in such a manner that the paste is subsequently further kneaded using a three-roll mill, and the silver powder contained in said paste is measured by laser diffraction scattering.

Furthermore; the silver powder preferably has a ratio $\eta_2/\eta_1$ of from 0.5 to 1.5, wherein $\eta_1$ is a viscosity at a shear rate of 4 sec$^{-1}$, obtained in such a manner that a paste obtained by kneading of the silver powder with an epoxy resin at a centrifugal force of 420 G is measured using a viscoelastometer, and $\eta_2$ is a viscosity at a shear rate of 4 sec$^{-1}$, obtained in such a manner that the paste is subsequently further kneaded using a three-roll mill and measured.

Effects of the Invention

The silver powder according to the present invention makes it possible to control an aggregation state of silver particles and maintain a viscosity in an appropriate range at the time of paste production, thereby prevent a viscosity change, and accordingly, kneading is easily performed and the occurrence of flakes are prevented, whereby the kneadability and printability can be improved.

Furthermore, the silver powder according to the present invention not only has excellent dispersibility in a paste, but also allows a wiring layer and an electrode which are formed of a resin-type silver paste or a baked-type silver paste using this silver powder to be excellent in uniformity and conductivity, and thus, the silver powder has a great industrial value as a powder for a silver paste used to form a wiring layer and an electrode of an electronic apparatus.

DETAILED DESCRIPTION OF THE INVENTION

Figure 1:
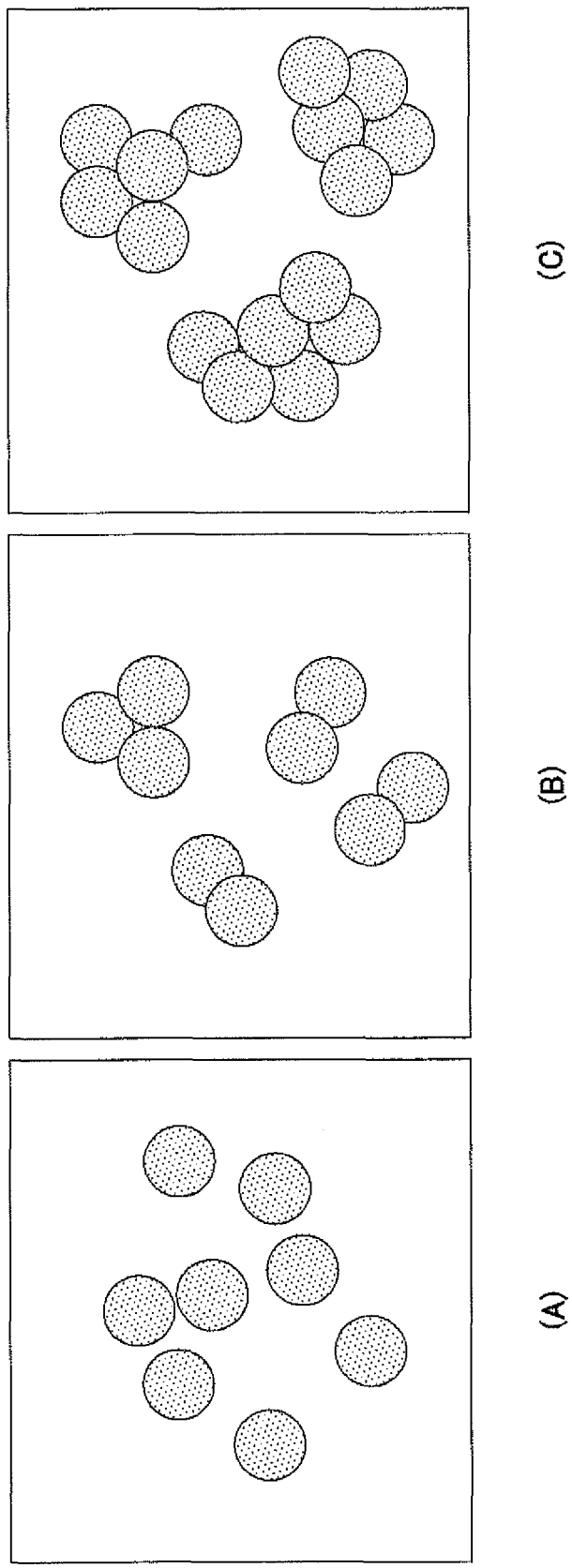
FIG. 1 schematically illustrates the forms of silver particles.

Hereinafter, a specific embodiment of the silver powder according to the present invention will be described in detail. It should be noted that the present invention is not limited to only the following embodiment, and various changes may be suitably made within the scope not deviating from the gift of the present invention.

In the following description, the names of the forms of silver particles are defined as illustrated in FIG. 1. That is, as illustrated in FIG. 1 (A), a silver particle which is regarded as a unit particle when judged from a geometric form of the silver particle in terms of appearance are referred to as a primary particle. Furthermore, as illustrated in FIG. 1 (B), a particle which is such that not less than two to three of the primary particles are connected to each other by necking are referred to as a secondary particle. Furthermore, as illustrated in FIG. 1 (C), an aggregate comprising the primary particles and the secondary particles is referred to as an aggregate. It should be noted that the primary particle, the secondary particle, and the aggregate are sometimes collectively called silver particles.

The present inventors found that, to secure an appropriate viscosity and good kneadability at the time of production of a silver powder paste, it is important that a silver powder is an aggregate having a certain aggregation strength. That is, a silver powder present in a paste comprises primary particles, secondary particles formed of a plurality of the primary particles connected each other, and aggregates formed by the aggregation of the primary particles and the secondary particles and having an appropriate strength (hereinafter, referred to as aggregates), and the silver powder and an organic solvent are present in the paste in a state they are unlikely to be separated from each other, and accordingly, the formation of coarse aggregate masses caused by excessive aggregation in the paste is prevented, and the viscosity of the paste is more easily adjusted and the kneadability is also improved.

Conventionally, in the production of a silver paste, there has been used a silver powder in which primary particles are independently dispersed as much as possible and which has a mean particle diameter of 0.1 to 1.5 µm. However, in the case of such fine silver particles in which primary particles are dispersed, the particles easily aggregate at the time of paste production, thereby forming coarse masses. In those aggregate masses, primary particles have more contact points with other primary particles and accordingly voids are less formed, and therefore, a solvent component of the paste hardly enters between the primary particles, and accordingly the apparent amount of the solvent freely flowing in the paste is increased. Then, the viscosity of the paste is decreased, and accordingly, for example, when kneading is performed by a three-roll mill, which is generally used for paste production, shear force is smaller, whereby kneading is insufficiently performed. As a result, it was found that aggregate masses enter a roller as they are without being broken, and consequently, coarse particles of the order of mm, such as flakes, are formed.

On the other hand, it was found that, in the case of a silver powder comprising mainly aggregates formed of primary particles or secondary particles which aggregate at a weak aggregate strength, the agglomerates are broken at the time of paste production; the foregoing state in which the primary particles are dispersed is caused; and coarse particles of the order of mm, such as flakes, are formed.

On the other hand, in the case of a silver powder in which the foregoing aggregates having a certain aggregation strength, the primary particles, and the secondary particles are mixed, an appropriate amount of a solvent component freely flows in a paste at the time of paste production, whereby the paste has an appropriate range of viscosity, and furthermore, the aggregates remain even after the paste production, and accordingly, kneading of the silver powder with other components such as a solvent and kneading by a three-roll mill can be easily performed. Furthermore, it was confirmed that the aggregates have a sufficient void therebetween and have a less number of contact points with each other, and accordingly, no large mass is formed in the paste, and no coarse flake occurs.

The foregoing aggregates have for example a grape-cluster-like shape, have a size of approximately 5 to 10 µm, and is presumed to comprise: secondary particles formed of a few silver particles comparatively strongly coupled to each other; and silver particles comparatively weakly coupled to the foregoing coupled particles. At an early stage of paste production, that is, at a stage of mixing a silver powder with a solvent component smoothly, for example, at a preliminary kneading stage in a general method for paste production in which the preliminary kneading using a kneader or the like and a main kneading using a three-roll mill or the like are conducted, a silver powder having particles including aggregates mixed therein is made into a paste having an appropriate viscosity (hereinafter, the paste is referred to as a kneaded material to distinguish the material from a finally-obtained paste) without the aggregation of fine primary particles and with the solvent component entering between the particles constituting the silver powder. The main kneading of such kneaded material allows a sufficient shear force to be applied between the silver particles, and accordingly allows the silver particles to be dispersed in the paste without aggregating. Furthermore, sufficiently dispersed silver particles hardly aggregate again, and therefore, the occurrence of flakes due to coarse aggregate masses can be prevented.

Also in a conventional silver powder containing primary particles dispersed therein, or a silver powder comprising mainly aggregates, kneading to appropriately adjust the viscosity of a kneaded material and finally form a paste can be carried out, but, the adjustment of the viscosity of the kneaded material makes a subsequent viscosity change larger, and accordingly, it becomes difficult to adjust the viscosity of a final paste to an appropriate value.

Too high or too low viscosity of a silver paste does not achieve a good printability of the paste. A silver powder including the mixture of aggregates, primary particles, and secondary particles even after paste production, that is, a silver powder having the foregoing aggregation strength allows the viscosity of the paste to be appropriately adjusted. Furthermore, the use of such silver powder makes it possible to achieve a paste having excellent printability.

The strength of an aggregate is related to the coupling strength between silver particles, and can be judged by comparing a specific surface area determined by the BET method with a specific surface area determined from a mean particle diameter obtained by image analysis of observation results by a scanning electron microscope (SEM). Here, the BET method is a method of determining the surface area of a powder by a vapor adsorption process, namely, a method of obtaining the total surface area of a 1-g sample, that is, a specific surface area, by an adsorption isotherm. Nitrogen gas is often used as an adsorption gas, and there is often used a method of measuring an adsorption amount by a change in the pressure or volume of an adsorbed gas. The specific surface area can be determined by multiplying an adsorption amount determined based on the BET equation by the area of a surface which is covered by one admolecule.

In the specific surface area measurement by the BET method, in the case where particles are weakly coupled to each other, for example, in the case where spherical primary particles are coupled to each other only at the point of contact, the surface area decreases only by a decrease in a contact portion at which the particles are coupled, and accordingly, the consequential specific surface area measured is slightly smaller than the total of a specific surface area in a state where primary particles are completely dispersed, that is, the specific surface area of the primary particles. Contrarily, in the case where particles are strongly coupled to each other, for example, in the case where primary particles are strongly coupled to form secondary particles in the shape of a gourd or a snowman, the specific surface area of a wide coupling portion decreases, and accordingly, the consequential specific surface area measured by the BET method is considerably smaller than the specific surface area of the primary particles. On the other hand, as mentioned above, a mean particle diameter obtained by a scanning-electron-microscope image analysis is a mean particle diameter of primary particles, and a specific surface area determined from this mean particle diameter is the total of the surface areas of particles each of which is regarded as a sphere, that is, approximates to the specific surface area of the primary particles.

Therefore, a specific surface area ratio $SA_B/SA_S$ serves as an index of aggregation of a silver powder and a spherical index of a silver powder, wherein $SA_S$ is a specific surface area calculated from a mean primary-particle diameter $D_S$ measured by a scanning-electron-microscope image analysis and $SA_B$ is a specific surface area measured by the BET method, and the use of this specific surface area ratio enables a judgment of how strongly the foregoing particles are coupled to each other, and accordingly enables a judgment of the strength of an aggregate. It should be noted that the specific surface area $SA_S$ calculated from the primary-particle diameter $D_S$ can be calculated using the following equation that indicates a relationship between a particle diameter and a specific surface area.

$$SA_S = 6/(\text{density} \times D_S)$$

(Ag density: 10.5 g/cm$^3$)

Furthermore, when the aggregation proceeds and more particles are coupled, the specific surface area decreases by the number of coupling portions, and hence, a specific surface area obtained by the BET method is considerably smaller than the specific surface area of primary particles. Hence, the foregoing specific surface area ratio $SA_B/SA_S$ can be considered as not only an index of aggregation strength, but also an index of size of the aggregates.

The silver powder according to the present invention has a specific surface area ratio ($SA_B/SA_S$) of from 0.5 to 0.9, wherein the specific surface area $SA_B$ is measured by the BET method and the specific surface area $SA_S$ is calculated from a primary-particle diameter $D_S$ measured by a scanning-electron-microscope image analysis. In this silver powder, formed aggregates have a predetermined strength, for example, the aggregation structure of the aggregates is maintained even through kneading, and the occurrence of flakes at the time of paste production can be more effectively prevented.

The specific surface area ratio $SA_B/SA_S$ of less than 0.5 implies that the aggregation proceeds and coarse aggregates having high strength are contained in a silver powder. Such aggregates contained in a silver powder could cause clogging at the time of screen-printing and a loss of uniformity of a wiring layer and an electrode which are formed with the silver paste. Therefore, to further improve printability at the time of screen-printing and uniformity of the wiring layer and the electrode, the foregoing $SA_B/SA_S$ is preferably not less than 0.6.

On the other hand, the specific surface area ratio $SA_B/SA_S$ of more than 0.9 implies that no aggregate is formed, or coupled particles are weakly coupled, and, for example, when kneading treatment is carried out at a pressure higher than predetermined, the aggregation structure of the particles is easily broken, whereby flakes occur.

Furthermore, whether aggregates contained in a silver powder are present or not can be judged by comparing mean particle diameters as follows. Specifically, the presence of the aggregates can be judged by comparing a volume median diameter $D_{50}$ measured using laser diffraction scattering with a mean particle diameter $D_S$ obtained by image analysis of SEM observation results.

The particle diameter measured by laser diffraction scattering indicates the particle diameter of particle units dispersed in a solvent, in other words, in the case where aggregating particles are contained, this particle diameter indicates a particle diameter of particles not only including primary particles dispersed alone, but also including the aggregates and secondary particles. On the other hand, a mean particle diameter obtained by SEM image analysis is a mean value of the particle diameters of primary particles. Hence, when a ratio obtained by dividing $D_{50}$ by $D_S$ is taken as the degree of aggregation, the degree of aggregation of higher than 1 implies that secondary particles and aggregates which are formed of primary particles coupled at a predetermined rate.

As mentioned above, kneadability at the time of paste production is also affected by the size of the aggregates. Hence, the silver powder preferably has a degree of aggregation of 1.5 to 5.0, the degree obtained in such a manner that a volume median diameter $D_{50}$ measured using laser diffraction scattering is divided by $D_S$.

In the case where the degree of aggregation is less than 1.5, a less number of aggregates are formed and accordingly there is a possibility of the occurrence of flakes at the time of paste production. On the other hand, in the case where the degree of aggregation is more than 5.0, silver particles aggregate too much thereby to form many coarse aggregates, thereby causing a possibility of a reduction in dispersion stability of the paste in a solvent and flake occurrence.

Furthermore, the silver powder preferably has a $D_S$ in a range of 0.1 to 1.5 μm. A mean particle diameter of primary particles of not less than 0.1 μm allows high resistance not to be caused and good conductivity to be achieved when the silver powder is made into a conductive paste. Furthermore, a mean particle diameter of primary particles of not more than 1.5 μm allows dispersibility not to be worsened and good rolling properties and good printability to be achieved even when primary particles are coupled to form aggregates having a determined size as mentioned later.

The strength of the foregoing aggregates can be judged also by the degree of aggregation and compressibility after application of a load to the silver powder. When a load is applied to the silver powder comprising a large number of silver particles from outside, aggregates having low strength are broken and fine primary particles increase accordingly, whereby the degree of aggregation decreases. In a silver powder having the low degree of aggregation after application of a load, aggregates have low strength, and the more aggregates are broken at the time of paste kneading, accordingly.

Hence, in the foregoing silver powder, the foregoing degree of aggregation after application of a load of 100 N/cm$^2$ is preferably 1.5 to 3.5. In the case where the degree of aggregation after the load application is less than 1.5, many aggregates are broken at the time of paste kneading, and coarse flakes sometimes occur. On the other hand, in the case where the degree of aggregation after the load application is more than 3.5, coarse aggregates remain even after paste production, whereby printability at the time of screen-printing is sometimes reduced. The application of a load to the silver powder can be performed in such a manner that, for example, using a powder-bed shear-stress analyzer, the silver powder is placed into a measuring vessel and a predetermined load is applied thereto.

Furthermore, the foregoing aggregates preferably have structural strength and do not easily cause a change in the structure thereof. This allows a state where the aggregates are present in a paste to be maintained, the viscosity of the paste not to decrease, the occurrence of a coarse powder such as flakes to be prevented, and good rolling properties to be exhibited. The compressibility is a volume reduction rate of a silver powder from a state of no load application until a state where a predetermined load is applied, and is an index indicating the amount of voids between silver particles and the structural strength of aggregates in a silver powder.

This compressibility can be determined by a volume (static bulk) measured without load application to a predetermined amount of a silver powder filled in a cell using a powder-bed shear-stress analyzer and a volume (bulk) measured with application of a predetermined load (for example, 60 N) thereto. When a load is applied to a silver powder using a powder-bed shear-stress analyzer, a powder bed is compressed, and in the case where silver particles are separated into primary particles, the amount of voids between the particles after the compression is smaller, and the compressibility is higher, accordingly. On the other hand, in the case where silver particles form the foregoing aggregates, the amount of the voids after the compression, including voids inside the aggregates, is larger, and the compressibility is lower, accordingly. However, in the case where, even when the aggregates are formed, the compressibility is too high in a state of the application of a predetermined load, it is implied that the aggregates do not have sufficient strength, and are easily crushed into primary particles at the time of paste kneading.

Usually, in the case where a resin-type or baked-type paste is produced using a silver powder, the paste is produced in such a manner that each component is measured and put into a predetermined vessel, and preliminary kneading is carried out using a rotary-and-revolutionary mixer or the like, and then, main kneading is carried out using a three-roll mill. As mentioned above, for aggregates having an appropriate size, it is important to maintain the aggregation structure thereof, and the aggregates preferably have an appropriate stability of the structure even when preliminary kneading and main kneading are carried out at the time of paste production. In other words, the foregoing aggregates have structural strength and do not easily cause a change in the structure thereof, whereby a state where the aggregates are present during paste production is maintained; the viscosity of a paste is not reduced; good dispersibility in a solvent is achieved; silver powders are prevented from aggregating in the paste to form a mass; and the occurrence of a coarse powder such as flakes is prevented.

The silver powder of the present invention has a compressibility of not less than 20% obtained by application of a load of 34 N/cm$^2$ in the measurement of the shear stress of a powder bed, preferably has a compressibility of not more than 40% obtained by application of a load of 113 N/cm$^2$. A compressibility of less than 20% obtained by application of a load of 34 N/cm$^2$ implies that the foregoing aggregates have a strong structure and the aggregation structure thereof is not easily broken, and accordingly, the aggregates themselves are crushed as they are at the time of paste production to cause the occurrence of flakes. On the other hand, a compressibility of more than 40% obtained by application of a load of 113 N/cm$^2$ implies that the foregoing aggregates have weak mechanical-strength and the aggregation structure thereof is easily broken, and silver particles are densely present at the time of paste production and accordingly have more contact points with other particles, thereby causing a stronger aggregation force, and therefore, the particles easily aggregate in a paste and coarse aggregate masses formed during kneading are crushed to cause the occurrence of flakes.

The silver powder having the foregoing compressibility contains aggregates which are formed of silver particles coupled to have a predetermined size and have many voids, and also the aggregates have structural strength. Such silver powder allows good dispersibility in a solvent to be achieved at the time of paste production, prevents silver powders from aggregating in a paste to form masses, and prevents the occurrence of a coarse powder such as flakes.

At this time, in the case of a silver powder which contains aggregates having low structural strength, the aggregates are broken at the early stage of kneading to become primary particles or secondary particles, whereby a paste is densely filled with the particles and the particles have more contact points with other particles to come to have a stronger aggregation force, and accordingly, the particles easily aggregate in the paste and flakes occur. Thus, kneadability is reduced.

The stability of the foregoing aggregation structure can be judged by comparing a volume median diameter $D_1$ and a volume median diameter $D_2$, wherein $D_1$ is determined in such a manner that, experimentally, a silver powder is kneaded with an epoxy resin at a centrifugal force of 420 G to produce a paste, and a silver powder in the paste is measured by laser diffraction scattering; and $D_2$ is determined in such a manner that the thus-obtained paste is subsequently further kneaded using a three-roll mil, and the silver powder contained in the paste is measured by laser diffraction scattering. In other words, usually, the structure of the aggregates crumble with kneading, and the median diameter of the silver powder is shifted to be smaller, and therefore, the comparison of the median diameter $D_1$ after preliminary kneading with the median diameter $D_2$ after main kneading enables a judgment of the stability of the structure of the aggregates.

In the evaluation of the structural stability of the aggregates, the silver powder according to the present embodiment preferably has a ratio $D_2/D_1$ of from 0.5 to 1.5, wherein $D_1$ is a volume median diameter obtained in such a manner that the silver powder is kneaded with an epoxy resin at a centrifugal force of 420 G to obtain a paste, and the silver powder in the paste is measured by laser diffraction scattering; and $D_2$ is a volume median diameter obtained in such a manner that the thus-obtained paste is subsequently further kneaded using a three-roll mill, and the silver powder contained in the paste is measured by laser diffraction scattering.

When the ratio $D_2/D_1$ is from 0.5 to 1.5, it can be judged that the structure of the aggregates is maintained stable even through preliminary kneading and main kneading. It should be noted that, when the ratio $D_2/D_1$ is less than 0.5, the structure of the aggregates is not stable, and accordingly the structure is broken by kneading, whereby there is a possibility of a sharp decrease in viscosity and the occurrence of flakes. On the other hand, when the ratio $D_2/D_1$ is more than 1.5, the aggregation structure is large and not easily broken, and accordingly coarse particles remain in a paste, whereby sometimes a screen is clogged up and printability is reduced.

An apparatus which is used to determine $D_1$ and performs kneading (preliminary kneading) of a silver powder with an epoxy resin at a centrifugal force of 420 G is not particularly limited as long as the apparatus is capable of kneading at a centrifugal force of 420 G, and for example, a rotary-and-revolutionary mixer may be used. Furthermore, to determine $D_2$, kneading (main kneading) using a three-roll mill is carried out under conditions of, for example a roller diameter of 150 mm and a rolling pressure of 10 bar.

Furthermore, the stability of the structure of the aggregates can be evaluated not only by comparing the mean particle diameters obtained after the respective kneading as mentioned above, but also by measuring the viscosities of pastes obtained after the respective kneading. In other words, as mentioned above, the silver powder according to the present embodiment contains aggregates having many voids and formed of primary particles and secondary particles aggregating to have a predetermined size. Therefore, as mentioned above, the viscosity increases at the early stage of paste production, but, in the case where the strength of the aggregates is weak, the viscosity is gradually shifted to be smaller with kneading. Therefore, the stability of the structure of the aggregates can be judged in such a manner that a paste is experimentally produced using a silver powder and an epoxy resin, and the comparison of the viscosity $\eta_1$ of the paste obtained after preliminary kneading with the viscosity $\eta_2$ of the paste obtained after main kneading is carried out.

The silver powder according to the present embodiment preferably has a ratio $\eta_2/\eta_1$ of from 0.5 to 1.5, wherein m is a viscosity at a shear rate of 4 $\sec^{-1}$, obtained in such a manner that a paste obtained by kneading the silver powder with an epoxy resin at a centrifugal force of 420 G is measured using a viscoelastometer, and $\eta_2$ is a viscosity at a shear rate of 4 $\sec^{-1}$, obtained in such a manner that the paste is subsequently further kneaded using a three-roll mill and measured.

In the case where the ratio $\eta_2/\eta_1$ is from 0.5 to 1.5, the structure of the aggregates is judged stable even through preliminary kneading and main kneading. In the case where the ratio $\eta_2/\eta_1$ is less than 0.5, the structure of the aggregates is not stable, and accordingly the structure is broken by kneading, whereby there is a possibility of a sharp decrease in the viscosity and the occurrence of flakes. In the case where the ratio $\eta_2/\eta_1$ is more than 1.5, printability is sometimes reduced.

The paste production to obtain $\eta_2/\eta_1$ may be carried out in the same manner as in the evaluation of the $D_2/D_1$. Furthermore, the viscoelastometer is not particularly limited as long as the viscoelastometer is capable of viscosity measurement at a desired shear rate. Furthermore, a paste for evaluation produced in this viscosity measurement preferably contains, for example, 80% by mass of a silver powder and 20% by mass of an epoxy resin (100 to 200 P (10 to 20 Pa·s)/25° C.), preferably (120 to 150 P (12 to 15 Pa·s)/25° C.).

The silver powder according to the present embodiment is not limited to the application to a specific silver paste, but is applicable to all silver pastes which have been commonly used. Specifically, in the case where a conductive silver paste is produced using the silver powder according to the present embodiment, the viscosity of the paste at a shear rate of 4 $\sec^{-1}$, measured by, for example, a cone-plate type viscometer, is 50 to 150 Pa·s. Furthermore, the viscosity at a shear rate of 20 $\sec^{-1}$ is 20 to 50 Pa·s.

In the case of a silver powder that causes the viscosity of a paste produced therewith to be lower than in the foregoing viscosity range, sometimes, bleeding, drips, and the like occur in wiring and the like which are formed by printing using the paste, and thus the shapes of the wiring and the like cannot be maintained. On the other hand, in the case of a silver powder that causes the viscosity of a paste produced therewith to be higher than in the foregoing viscosity range, it is sometimes difficult to conduct printing using the paste.

Furthermore, the silver powder according to the present embodiment which has the foregoing excellent paste characteristics can be said to be capable of effectively preventing the formation of coarse aggregate masses caused by excessive aggregation, even in a silver paste which has been commonly used. That is, in a silver powder which causes excessive aggregation in a paste and accordingly causes the formation of coarse aggregate masses, flakes formed of the crushed aggregate masses occur. Furthermore, in a silver powder containing excessive aggregates, the viscosity at the time of paste production is too high, thereby causing difficulties in kneading and the like, whereby a problem arises in the paste production. Furthermore, the thus-produced silver paste has poor paste characteristics such as poor printability. The silver powder according to the present embodiment allows the production of a paste having an appropriate viscosity mentioned above, and therefore, excessive aggregation is prevented, whereby a problem caused by the formation of coarse aggregate masses can be effectively prevented.

It should be noted that, in the production of a silver paste by using the silver powder according to the present embodiment which has the foregoing characteristics, a method for making the silver powder into a paste is not particularly limited, and a well-known method may be employed. For example, as a vehicle to be used, there may be used a material obtained by dissolving various kinds of cellulose, phenol resin, acrylic resin, or the like in a solvent, such as an alcoholic solvent, an ether-based solvent, or an ester-based solvent.

Next, a method for producing a silver powder having the foregoing characteristics will be described.

The method for producing the silver powder according to the present embodiment, for example, uses silver chloride or silver nitrate as a starting material, and is basically such that a silver-complex-containing solution obtained by dissolving a starting material such as silver chloride in a complexing agent is mixed with a reducing agent solution to reduce the silver complex and precipitate silver particles, whereby a silver particle slurry is obtained, and the slurry undergoes the steps of washing, drying, and pulverizing, whereby the silver powder is obtained.

Furthermore, in the method for producing the silver powder according to the present embodiment, 1.0% to 15.0% by mass, more preferably 1.0% to 10.0% by mass, still more preferably more than 3.0% by mass and not more than 10.0% by mass of a water-soluble polymer with respect to silver is added to the reducing agent solution to reduce the silver complex.

Furthermore, in the method for producing the silver powder according to the present embodiment, when the steps of washing, drying, and pulverizing are performed after the silver particle slurry is obtained by reducing the silver complex with the foregoing reducing agent solution, the pulverization is conducted after the drying with weak agitation using a rolling agitator having a vacuum reduced-pressure atmosphere, or the like.

As mentioned above, 1.0% to 15.0% by mass, more preferably 1.0% to 10.0% by mass, still more preferably more than 3.0% by mass and not more than 10.0% by mass of a water-soluble polymer with respect to silver is added to the reducing agent solution to reduce the silver complex, and also, an obtained silver particle slurry is dried, and then pulverized with weakly agitated, whereby the aggregation state of silver particles can be controlled, and accordingly the silver powder having the appropriate aggregates can be produced.

Hereinafter, taking a case where silver chloride is used as a starting material as a preferable aspect in the method for producing the silver powder, each of the steps will be more specifically described. It should be noted that, also in the case where a material other than silver chloride is used as a starting material, the silver powder can be obtained in the same manner as in the case of using silver chloride, but, in the case where silver nitrate is used as a starting material, it is necessary to install an apparatus for collecting nitrous acid gas and an apparatus for treating nitrate-based nitrogen contained in waste water.

In the reduction step, first, silver chloride as a starting material is dissolved using a complexing agent, whereby a silver-complex-containing solution is prepared. The complexing agent is not particularly limited, but, there is preferably used aqueous ammonia, which easily forms a complex with silver chloride and does not contain a component that remains as an impurity. Furthermore, silver chloride to be used is preferably highly purified, for example, high-purity silver chloride is preferably used.

A method for dissolving silver chloride is such that, for example, in the case where aqueous ammonia is used as a complexing agent, aqueous ammonia may be added to a slurry prepared using silver chloride or the like, but, in order to increase the concentration of a complex and thereby to raise productivity, silver chloride is preferably added to aqueous ammonia and dissolved therein. As the aqueous ammonia to be used for the dissolution, ordinary aqueous ammonia for industrial use may be used, but, aqueous ammonia having a purity as high as possible is preferably used in order to prevent impurity contamination.

Next, a reducing agent solution to be mixed with a silver complex solution is prepared. As the reducing agent, a material having strong reducing power, such as ascorbic acid, hydrazine, or formalin, is preferably used. Particularly, ascorbic acid is preferably used because crystalline particles in silver particles easily grow. Hydrazine and formalin has stronger reducing power than ascorbic acid, and therefore allows crystals in silver particles to be made smaller. Furthermore, in order to control reaction uniformity or reaction rate, there may be used an aqueous solution whose concentration is adjusted by dissolving or diluting a reducing agent with pure water or the like.

As mentioned above, in the method for producing the silver powder according to the present embodiment, 1.0% to 15.0% by mass, more preferably 1.0% to 10.0% by mass, still more preferably more than 3.0% by mass and not more than 10.0% by mass of a water-soluble polymer with respect to silver is added to the reducing agent solution.

As mentioned above, the choice of a water soluble polymer as an aggregation inhibitor and the amount of the water soluble polymer added are of importance to the production of the silver powder according to the present embodiment. Silver particles (primary particles) formed by reduction using a reducing agent solution have active surfaces, thereby easily coupling to other silver particles to form secondary particles. Furthermore, the secondary particles aggregate to form aggregates. At this time, the use of an aggregation inhibitor having a high effect of preventing aggregation, such as a surface active agent or fatty acid, causes insufficient formation of the secondary particles and the aggregates, whereby the primary particles increase and aggregates having an appropriate size are not formed. On the other hand, the use of an aggregation inhibitor having a low effect of preventing aggregation causes excessive formation of the secondary particles and the aggregates, whereby a silver powder containing excessively aggregating coarse aggregates is formed. A water-soluble polymer has an appropriate effect of preventing aggregation, and therefore, the adjustment of the amount of a water soluble polymer added allows the formation of the secondary particles and the aggregates to be easily controlled, whereby the aggregates having an appropriate size can be formed in a silver-complex-containing solution obtained after the addition of a reducing agent solution.

The water soluble polymer to be added is not particularly limited, but preferably at least one kind selected from polyethylene glycol, polyvinyl alcohol, polyvinyl pyrrolidone, gelatin, and the like, more preferably at least one kind selected from polyethylene glycol, polyvinyl alcohol, and polyvinyl pyrrolidone. These water soluble polymers prevent particularly excessive aggregation and also prevent silver particles (primary particles) from being made minute due to insufficient aggregation of grown-up nuclei, whereby a silver powder including aggregates having a predetermined size can be easily formed.

Here, a mechanism in which the addition of a water soluble polymer causes silver particles to be connected to each other to form aggregates having a predetermined size is considered as follows. That is, when a water soluble polymer is added, the water soluble polymer adsorbs onto the surfaces of silver particles. At this time, it is considered that, when almost all of the surfaces of the silver particles are coated with a water soluble polymer, each of the silver particles is present independently, but, when the water soluble polymer is added at a predetermined ratio with respect to silver, a part of the surfaces remains without the presence of the water soluble polymer, whereby the silver particles are connected to each other via such surfaces to form aggregates.

Hence, the amount of a water soluble polymer added is set to 1.0% to 15.0% by mass with respect to silver. In the case where the amount of a water soluble polymer added is less than 1.0% by mass with respect to silver, the dispersibility in a silver particle slurry is worsened, whereby a silver powder excessively aggregates to cause the occurrence of many coarse aggregates. On the other hand, in the case where the amount of a water soluble polymer added is more than 15.0% by mass with respect to silver, almost all of the surfaces of silver particles are coated with the water soluble polymer, whereby the silver particles cannot be coupled to each other and accordingly aggregates cannot be formed. As a result, a silver powder comprising primary particles is formed, and, also in this case, flakes occur at the time of paste production.

Therefore, the addition of 1.0% to 15.0% by mass of a water soluble polymer with respect to silver enables silver particles to be appropriately connected to each other via the surfaces on which the water soluble polymer is not present, and structurally stable aggregates to be formed, whereby good dispersibility at the time of paste production can be achieved, and also flake occurrence can be effectively prevented. Furthermore, it is more preferable to add a water soluble polymer at 1.0% to 10.0% by mass with respect to silver. An addition amount of 1.0% to 10.0% by mass of a water soluble polymer enables the water soluble polymer to more appropriately adsorb onto the surfaces of silver particles; the silver particles to be connected to each other to the extent that the connected silver particles have a predetermined size thereby to form highly stable aggregates; and flake formation to be more effectively prevented.

Furthermore, the water soluble polymer is added to a reducing agent solution. The addition of the water soluble polymer to a reducing agent solution leads to the water soluble polymer to be present at the stage of nucleation or nucleus growth, and the water soluble polymer to quickly adsorb onto the surfaces of formed nuclei or silver particles, whereby aggregation of the silver particles can be efficiently controlled. Thus, in combination with the foregoing adjustment of the concentration of the water soluble polymer, the advance addition of the water soluble polymer to a reducing agent solution prevents the formation of coarse aggregates due to excessive aggregation of silver particles, and allows silver particles to be more appropriately connected to each other to the extent that the connected silver particles have a predetermined size, thereby forming highly stable aggregates.

It should be noted that a part or a whole amount of the water soluble polymer to be added may be added beforehand to a silver-complex-containing solution, but, in this case, the water soluble polymer is hardly supplied at the stage of nucleation or nucleus growth, and accordingly there is a risk that the water soluble polymer cannot adsorb appropriately onto the surfaces of silver particles. Therefore, in the case where the water soluble polymer is added beforehand to a silver-complex-containing solution, the amount of the water soluble polymer added is preferably more than 3.0% by mass with respect to silver. Hence, in the case where the water soluble polymer is allowed to be added to any of a reducing agent solution and a silver-complex-containing solution, the amount of the water soluble polymer added is preferably more than 3.0% by mass and not more than 10.0% by mass with respect to silver.

The addition of the water soluble polymer sometimes causes foaming at the time of a reduction reaction, and therefore a defoaming agent may be added to a silver-complex-containing solution or a reducing-agent-mixed solution. The defoaming agent is not particularly limited, and a defoaming agent that has been commonly used at the time of reduction may be employed. It should be noted that, in order not to inhibit a reduction reaction, the amount of a defoaming agent added is preferably a minimum amount required to achieve defoaming effects.

As for water which is to be used for preparation of a silver-complex-containing solution and a reducing agent solution, in order to prevent contamination with impurities, water from which impurities are removed is preferably used, and pure water is particularly preferably used.

Next, the silver-complex-containing solution and the reducing agent solution which are prepared as mentioned above are mixed to reduce a silver complex, whereby silver particles are precipitated. For this reduction reaction, a batch method may be employed, or a continuous reduction method, such as a tube reactor method or an overflow method, may be employed. To obtain primary particles having a uniform particle diameter, a tube reactor method is preferably used because the method allows particle growth time to be easily controlled. Furthermore, the particle diameter of the silver particles can be controlled by a mixing rate of a silver-complex-containing solution and a reducing agent solution or by a reduction rate of a silver complex, whereby the particle diameter of the silver particles can be easily controlled to a target particle diameter.

Onto the surfaces of the silver particles obtained in the reduction step, a large number of chlorine ions and the water soluble polymer adsorb. Therefore, to achieve sufficient conductivities of a wiring layer and an electrode which are formed using the silver paste, it is preferable that a slurry of the obtained silver particles is washed in the following washing step, whereby surface adsorbates are removed by the washing. It should be noted that, as mentioned later, in order to prevent the occurrence of excessive aggregation due to the removal of the water soluble polymer adsorbing onto the surfaces of the silver particles, the washing step is preferably performed after the surface treatment step for the silver particles and the like.

A method for the washing is not particularly limited, but, there is commonly used a method in which silver particles separated from the silver particle slurry by solid-liquid separation using a filter press or the like are fed into a washing liquid, and agitated using an agitator or an ultrasonic washer, and then solid-liquid separation is performed again to collect silver particles. Furthermore, to sufficiently remove surface adsorbates, there is preferably repeated several times an operation comprising: feeding into a washing liquid; agitating and washing; and solid-liquid separation.

As the washing liquid, water may be used, or, to efficiently remove chlorine, an alkaline solution may be used. The alkaline solution is not particularly limited, but, a sodium hydroxide solution, which leaves less impurities and is inexpensive, is preferably used. In the case where a sodium hydroxide solution is used as the washing liquid, it is preferable that, after the washing with a sodium hydroxide solution, the silver particles or a slurry thereof is further washed with water to remove sodium.

The sodium hydroxide solution preferably has a concentration of 0.01 to 0.30 mol/l. A sodium hydroxide solution having a concentration of less than 0.01 mol/l has an insufficient washing effect, on the other hand, a sodium hydroxide solution having a concentration of more than 0.30 mol/l causes sodium having an amount more than allowed to remain in the silver particles. It should be noted that, as the water to be used as a washing liquid, water not containing an impurity element harmful to the silver particles is preferable, and pure water is particularly preferable.

In the method for producing the silver powder according to the present embodiment, prior to the formation of coarse aggregate masses caused by further aggregation of aggregates formed by reduction in the silver-complex-containing solution, a surface treatment is preferably applied to the surfaces of the formed aggregates with a treatment agent having a high effect of preventing aggregation thereby to prevent excessive aggregation. In other words, after the foregoing aggregates are formed and before excess aggregation proceeds, silver particles are treated with a surface active agent, or, more preferably, a surface treatment step to treat silver particles with a surface active agent and a dispersing agent is carried out. This enables excessive aggregation to be prevented, the structural stability of desired aggregates to be maintained, and the formation of coarse aggregate masses to be effectively prevented.

The excessive aggregation of the silver particles proceeds particularly by drying, and therefore the surface treatment performed at any stage before the silver particles are dried is effective. For example, the surface treatment may be performed after the reduction step and before the foregoing washing step, performed simultaneously with the washing step, or performed after the washing step.

Among them, it is particularly preferable to perform the surface treatment after the reduction step and before the washing step or perform after the first washing step. This allows aggregates formed through the reduction treatment and having a predetermined size to be maintained, and, since the surface treatment is applied to silver particles including the aggregates, a silver powder having good dispersibility can be produced.

More specifically, in the present embodiment, the reduction is carried out by adding a water soluble polymer to a reducing agent solution at a predetermined ratio with respect to silver, whereby the water soluble polymer appropriately adsorbs onto the surfaces of silver particles to form aggregates in which the silver particles are connected to each other and accordingly which have a predetermined size. However, the water soluble polymer adsorbing onto the silver particle surfaces is relatively easily washed by the washing treatment, and therefore, in the case where the washing step is performed prior to the surface treatment, there is a risk that the water soluble polymer on the surfaces of the silver particles is washed and removed, whereby the silver particles start to excessively aggregate each other, and coarse aggregate masses larger than the formed aggregates are formed. Furthermore, the formation of such coarse aggregate masses causes difficulties in giving the surface treatment uniformly to the surfaces of the silver particles.

Hence, the surface treatment conducted after the reduction step and before the washing step or conducted after the first washing step prevents excessive aggregation of the silver particles due to the removal of the water soluble polymer can be prevented and also the surface treatment can be efficiently applied to the silver particles including the desirably formed aggregates, whereby a silver powder not including a coarse aggregate and having good dispersibility can be produced. It should be noted that the surface treatment subsequent to the reduction treatment and prior to the washing step is preferably performed after a slurry containing silver particles is solid-liquid separated using a filter press or the like after the completion of the reduction step. The surface treatment is thus performed after the solid-liquid separation, whereby a surface active agent and a dispersing agent which serve as surface treatment agents can be made to directly act on the silver particles including the aggregates which are formed in a predetermined size, and the surface treatment agent appropriately adsorbs onto the formed aggregates, thereby more effectively preventing the formation of aggregate masses which excessively aggregate.

In this surface treatment step, it is more preferable that the surface treatment is performed using both a surface active agent and a dispersing agent. Such surface treatment using both a surface active agent and a dispersing agent allows a firm surface-treated layer to be formed on the surfaces of silver particles by the interaction of the surface active agent with the dispersing agent, and hence, the surface treatment has a high effect of preventing excessive aggregation, and is effective in maintaining desired aggregates. As a specific method of a preferable surface treatment using both a surface active agent and a dispersing agent, it is beneficial that silver particles are fed into water to which the surface active agent and the dispersing agent are added, and agitated; or silver particles are fed into water to which the surface active agent is added, and agitated, and then the dispersing agent is added thereto and agitated. In the case where the surface treatment is performed simultaneously with the washing step, it is beneficial to add a surface active agent and a dispersing agent simultaneously to a washing liquid, or to add a dispersing agent after the addition of a surface active agent. To achieve better adsorption of a surface active agent and a dispersing agent onto silver particles, it is preferable that the silver particles are fed into water or a washing liquid to each of which a surface active agent is added, and agitated, and then furthermore a dispersing agent is added thereto and agitated.

Another embodiment may be such that a surface active agent is fed into a reducing agent solution, and a dispersing agent is fed into a silver particle slurry obtained by mixing a silver-complex-containing solution with the reducing agent solution, and agitated. A stable and uniform surface treatment can be carried out in such a manner that a surface active agent is present at the stage of nucleation or nucleus growth, thereby quickly adsorbing onto the surfaces of formed nuclei or silver particles, and furthermore a dispersing agent is made to adsorb thereonto.

Here, the surface active agent is not particularly limited, but a cationic surface active agent is preferably employed. A cationic surface active agent is ionized to form a positive ion without being affected by pH, and therefore, for example, there is obtained an effect of improving the adsorptivity onto a silver powder obtained by using silver chloride as a starting material.

The cationic surface active agent is not particularly limited, but preferably at least one kind selected from alkyl monoamine salts, typified by monoalkylamine salts; alkyl diamine salts, typified by N-alkyl (C14 to C18) propylene-diamine dioleate; alkyl trimethyl ammonium salts, typified by alkyl trimethyl ammonium chloride; alkyl dimethyl benzyl ammonium salts, typified by alkyl dimethyl benzyl ammonium chloride; quaternary ammonium salts, typified by alkyl dipolyoxyethylene methyl ammonium chloride; alkyl pyridinium salts; tertiary amine salts, typified by dimethylstearylamine; polyoxyethylene alkylamine, typified by polyoxypropylene polyoxyethylene alkylamine; diamine oxyethylene adducts, typified by N,N',N'-tris(2-hydroxyethyl)-N-alkyl (C14 to C18) 1,3-diaminopropane, and more preferably any of or a mixture of a quaternary ammonium salt and a tertiary amine salt.

Furthermore, the surface active agent preferably has at least one alkyl group having a carbon number of C4 to C36, typified by a methyl group, a butyl group, a cetyl group, a stearyl group, beef tallow, hardened beef tallow, and a plant-based stearyl. As the alkyl group, preferable is an alkyl group to which there is added at least one kind selected from polyoxyethylene, polyoxypropylene, polyoxyethylene polyoxypropylene, polyacrylic acid, and polycarboxylic acid. These alkyl groups can strongly adsorb to fatty acid which is to be used as a later-mentioned dispersing agent, and therefore, in the case where a dispersing agent is made to adsorb to silver particles via a surface active agent, fatty acid can be made to strongly adsorb thereto.

The amount of a surface active agent added is preferably in a range of 0.002% to 1.000% by mass with respect to the silver particles. Almost all amount of the surface active agent adsorbs onto the silver particles, and hence, the addition amount of the surface active agent is almost equal to the adsorption amount thereof. When the amount of a surface active agent added is less than 0.002% by mass, an effect of preventing the aggregation of the silver particles or an effect of improving the adsorptivity of a dispersing agent sometimes cannot be obtained. On the other hand, when the amount of a surface active agent added is more than 1.000% by mass, the conductivities of a wiring layer and an electrode which are formed using the silver paste are reduced, and hence, such addition amount is not preferable.

As the dispersing agent, for example, a protective colloid, such as fatty acid, organic metal, or gelatin, may be used, but, fatty acid or a salt thereof is preferably used because fatty acid and a salt thereof incur no risk of impurity contamination and have good adsorptivity to a surface active agent. It should be noted that fatty acid or a salt thereof may be added as an emulsion.

Fatty acid to be used as a dispersing agent is not particularly limited, but preferably at least one kind selected from stearic acid, oleic acid, myristic acid, palmitic acid, linoleic acid, lauric acid, and linolenic acid. This is because these kinds of fatty acid have a comparatively low boiling point and therefore have less adverse effects on a wiring layer and an electrode which are formed using the silver paste.

Furthermore, the amount of a dispersing agent added is preferably in a range of 0.01% to 1.00% by mass with respect to the silver particles. The amount of a dispersing agent adsorbing onto the silver particles differs depending on the type of the dispersing agent, but, when the amount of a dispersing agent added is less than 0.01% by mass, the dispersing agent sometimes does not adsorb onto the silver powder in an amount large enough to achieve an effect of preventing aggregation of the silver particles or an effect of improving the adsorptivity of the dispersing agent. On the other hand, when the amount of a dispersing agent added is more than 1.00% by mass, too large an amount of the dispersing agent adsorbs onto the silver particles, and therefore a wiring layer and an electrode which are formed using the silver paste sometimes have insufficient conductivity.

After the washing and the surface treatment, solid-liquid separation is performed to collect silver particles. It should be noted that, as an apparatus to be used for the washing and the surface treatment, a commonly used apparatus, for example, a reaction vessel with an agitator, or the like may be used. Furthermore, as an apparatus to be used for the solid-liquid separation, a commonly used apparatus, for example, a centrifuge, a suction filter, a filter press, or the like may be used.

The silver particles obtained after the completion of the washing and the surface treatment are dried by evaporating moisture in a drying step. A method for the drying is such that, for example, a silver powder collected after the completion of the washing and the surface treatment is placed on a stainless steel pad, and heated at a temperature of 40° C. to 80° C. using a commercially available drying apparatus, such as an air oven or a vacuum dryer.

Then, in the method for producing the silver powder according to the present embodiment, a pulverization treatment is applied under light-pulverization conditions to a dried silver powder which is obtained in such a way that the aggregation of silver particles is controlled by the reduction step and preferably the degree of the aggregation is stabilized by the surface treatment. In the silver powder obtained after the foregoing surface treatment, even if the aggregates further aggregate each other due to the drying or the like performed after the surface treatment, the aggregates have a weak bonding strength, and therefore, at the time of paste production, the aggregates are easily separated from each other to the extent that the aggregates have a predetermined size. However, to stabilize the paste, pulverization and classification are preferably performed.

Specifically, the pulverization conditions of the pulverization method are such that, using an apparatus having a low pulverizing power, such as a rolling agitator having a vacuum reduced-pressure atmosphere, silver particles obtained after the drying are pulverized while being agitated at a peripheral speed of an agitating impeller of, for example, 5 to 35 m/s. Such light pulverization of the silver powder obtained after the drying can prevent the pulverization of the aggregates which are formed of the silver particles connected to each other and have a predetermined size. When the peripheral speed is less than 5 m/s, pulverization energy is weak, thereby causing a large number of aggregates to remain, on the other hand, when the peripheral speed is more than 35 m/s, pulverization energy is strong, thereby causing too small a number of aggregates to remain, and thus, in both the cases, a silver powder having the foregoing particle size distribution cannot be obtained.

After the foregoing pulverization, classification is performed, whereby a silver powder having a desired particle size or less can be obtained. A classification apparatus to be used for the classification is not particularly limited, and an airflow classifier, a sieve, or the like may be used.

EXAMPLES

Hereinafter, specific examples of the present invention will be described. It should be noted that the present invention is not limited to the following examples.

Example 1

While being agitated, 2492 g of silver chloride (manufactured by Sumitomo Metal Mining Co., Ltd., 1876 g of silver contained in the silver chloride) was fed into 36 L of 25% aqueous ammonia maintained at a liquid temperature of 36° C. in a warm bath having a temperature of 38° C., whereby a silver complex solution was prepared. A defoaming agent (ADEKANOL LG-126, manufactured by ADEKA Corporation) was diluted 100 times at a volume ratio, and 24.4 ml of this diluted solution of the defoaming agent was added to the foregoing silver complex solution, and the obtained silver complex solution was maintained at a temperature of 36° C. in a warm bath.

On the other hand, 1068 g of ascorbic acid (a reagent, manufactured by KANTO CHEMICAL Co., Inc., 56.9% by mass with respect to the silver particles) as a reducing agent was dissolved in 13.56 L of pure water having a temperature of 36° C., whereby a reducing agent solution was prepared. Next, a 160 g aliquot of polyvinyl alcohol (PVA205, manufactured by KURARAY Co., Ltd., 8.5% by mass with respect to silver) as a water soluble polymer was taken and dissolved in 1 L of pure water having a temperature of 36° C., and the thus-obtained solution was mixed with the reducing agent solution.

Using a Mono pump (manufactured by HEISHIN Ltd.), the prepared silver complex solution and the prepared reducing agent solution were sent to a pipe at 2.7 L/min and 0.9 L/min, respectively, whereby a silver complex was reduced. The reduction rate at this time was 127 g/min on a basis of the amount of silver. Furthermore, a ratio of the supply rate of a reducing agent to the supply rate of silver was set to 1.4. It should be noted that, as the pipe, a polyvinyl chloride pipe having an inside diameter of 25 mm and a length of 725 mm was employed. While being agitated, a slurry which contained silver particles obtained by the reduction of the silver complex was received in a receiving tank.

After that, the silver particle slurry obtained by the reduction was solid-liquid separated to collect silver particles, and the thus-collected silver particles before drying, and 0.75 g of polyoxyethylene addition quaternary ammonium salt, a commercial cationic surface active agent, (Cirrasol, manufactured by Croda Japan KK, 0.04% by mass with respect to the silver particles) as a surface treatment agent and 14.08 g of a stearate emulsion (Selosol 920, manufactured by Chukyo Yushi Co., Ltd., 0.11% by mass of stearic acid and palmitic acid in total with respect to the silver particles) as a dispersing agent were fed into 15.4 L of pure water and agitated for 60 minutes to implement a surface treatment. After the surface treatment, the silver particle slurry was filtered using a filter press, whereby the silver particles were solid-liquid separated.

Subsequently, before the collected silver particles are dried, the silver particles were fed into 15.4 L of a 0.05 mol/L sodium hydroxide (NaOH) solution, and agitated for 15 minutes to be washed, and then filtered using a filter press to collect silver particles.

Next, the collected silver particles were fed into 23 L of pure water maintained at a temperature of 40° C., agitated and filtered, and then, the silver particles were transferred to a stainless steel pad and dried at a temperature of 60° C. for 10 hours using a vacuum dryer. Then, a 1.75 kg aliquot of the dried silver powder was taken and fed into a 5 L Henschel mixer (FM5C, manufactured by NIPPON COKE & ENGINEERING Co., Ltd.). Inside the Henschel mixer, with agitation for 30 minutes at 2000 revolutions per minute (at a peripheral speed of an agitating impeller of 18.2 m/s), decompression was conducted using a vacuum pump to perform pulverization, whereby a silver powder was obtained.

For the obtained silver particles, a specific surface area $SA_S$ was determined from a mean primal-particle diameter $D_S$ obtained by measuring 200 primary particles by SEM observation, and a specific surface area $SA_B$ was measured by the BET method, whereby a specific surface area ratio $SA_B/SA_S$ was calculated. Furthermore, the silver powder was dispersed in isopropyl alcohol, and a volume median diameter $D_{50}$ was measured using laser diffraction scattering, whereby the degree of aggregation ($D_{50}/D_S$) was determined.

Furthermore, using a powder-bed shear-stress analyzer (NS-S300, manufactured by Nano Seeds Corporation), compressibility was measured. The measurement was conducted in such a manner that 18 g of the obtained silver powder was placed into a measuring vessel having an internal diameter of 15 mm, and the measurements of the silver powder in the vessel were successively performed with application of a predetermined load of 60 N (34 N/cm$^2$) and a predetermined load of 200 N (113 N/cm$^2$), respectively. At this time, the rate of compressing the silver powder was set to 0.2 mm/sec, and the compressing was stopped at the point when a predetermined applied load was attained, and a bulk at the predetermined applied load was read out. Compressibility was determined in such a manner that a volume (bulk) measured at the time of application of the predetermined load was divided by a volume (static bulk) measured without load application to a silver powder filled in the measuring vessel. Furthermore, the applied load was increased to 100 N/cm$^2$, and then, the silver powder was taken out of the measuring vessel, and the degree of aggregation ($D_{50}/D_S$) was determined in the same manner as above.

Next, 80% by mass of the obtained silver powder and 20% by mass of an epoxy resin (819, manufactured by Mitsubishi Chemical Corporation) were weighed out, and kneaded using a rotary-and-revolutionary mixer (ARE-250, manufactured by THINKY CORPORATION) at a centrifugal force of 420 G to be made into a paste, and then, further kneaded using a three-roll mill (three-roll mill SDY-300, manufactured by Buhler) and evaluated. During the kneading by the three-roll mill, the occurrence of flakes was not visually observed, and kneadability was good.

A viscosity $\eta_1$ of the obtained paste after the kneading by the rotary-and-revolutionary mixer at a shear rate of 4 sec$^{-1}$ and a viscosity $\eta_2$ of the paste after the kneading by the three-roll mill were measured using a viscoelastometer (MCR-301, manufactured by Anton Paar), whereby $\eta_2/\eta_1$ was determined.

Furthermore, the paste obtained after the kneading by the rotary-and-revolutionary mixer and the paste obtained after the kneading by the three-roll mill each were dispersed in isopropyl alcohol, and the volume median diameter of each of the pastes was measured by laser diffraction scattering to determine $D_2/D_1$.

Table 1 collectively shows the mean primary-particle diameter $D_S$, the specific surface area $SA_B$, the specific surface area ratio $SA_B/SA_S$, the degree of aggregation, the degree of aggregation after application of a load of 100 N/cm$^2$, the compressibilities at the time of application of loads of 34 N/cm$^2$ and 113 N/cm$^2$, the $D_2/D_1$, and the $\eta_2/\eta_1$.

Example 2

In Example 2, a silver powder was obtained and evaluated in the same manner as in Example 1, except that the addition amount of polyvinyl alcohol as a water soluble polymer was 66 g (3.5% by mass with respect to silver).

Silver particles obtained were evaluated in the same manner as in Example 1. During the kneading by the three-roll mill, the occurrence of flakes was not visually observed, and rolling properties were good. Table 1 shows the mean primary-particle diameter $D_S$, the specific surface area $SA_B$, the specific surface area ratio $SA_B/SA_S$, the degree of aggregation, the degree of aggregation after application of a load of 100 N/cm$^2$, the compressibilities at the time of application of loads of 34 N/cm$^2$ and 113 N/cm$^2$, the $D_2/D_1$, and the $\eta_2/\eta_1$.

Example 3

In Example 3, a silver powder was obtained and evaluated in the same manner as in Example 1, except that the addition amount of polyvinyl alcohol as a water soluble polymer was 230 g (12% by mass with respect to silver).

Silver particles obtained were evaluated in the same manner as in Example 1. During the kneading by the three-roll mill, the occurrence of flakes was not visually observed, and rolling properties were good. Table 1 shows the mean primary-particle diameter $D_S$, the specific surface area $SA_B$, the specific surface area ratio $SA_B/SA_S$, the degree of aggregation, the degree of aggregation after application of a load of 100 N/cm$^2$, the compressibilities at the time of application of loads of 34 N/cm$^2$ and 113 N/cm$^2$, the $D_2/D_1$, and the $\eta_2/\eta_1$.

Example 4

In Example 4, a silver powder was obtained and evaluated in the same manner as in Example 1, except that the addition amount of polyvinyl alcohol as a water soluble polymer was 9.4 g (0.5% by mass with respect to silver).

Silver particles obtained were evaluated in the same manner as in Example 1. During the kneading by the three-roll mill, the occurrence of flakes was not visually observed, and rolling properties were good. Table 1 shows the mean primary-particle diameter $D_S$, the specific surface area $SA_B$, the specific surface area ratio $SA_B/SA_S$, the degree of aggregation, the degree of aggregation after application of a load of 100 N/cm$^2$, the compressibilities at the time of application of loads of 34 N/cm$^2$ and 113 N/cm$^2$, the $D_2/D_1$, and the $\eta_2/\eta_1$.

Comparative Example 1

In Comparative Example 1, a silver powder was obtained and evaluated in the same manner as in Example 1, except that the addition amount of polyvinyl alcohol as a water soluble polymer was 380 g (20% by mass with respect to silver). The kneading by the rotary-and-revolutionary mixer caused a paste having a low viscosity, and as a result of the kneading by the three-roll mill, the occurrence of flakes was confirmed during the kneading. The obtained silver powder had a small aggregation structure, caused the occurrence of many flakes, and had difficulties in being made into a paste. Since it was difficult to make the silver powder into a paste, $D_2/D_1$ and $\eta_2/\eta_1$ could not be evaluated.

Table 1 collectively shows the mean primary-particle diameter $D_S$, the specific surface area $SA_B$, the specific surface area ratio $SA_B/SA_S$, the degree of aggregation, the degree of aggregation after application of a load of 100 N/cm$^2$, and the compressibilities at the time of the application of loads of 34 N/cm$^2$ and 113 N/cm$^2$.

Comparative Example 2

A silver powder was obtained and evaluated in the same manner as in Example 1, except that the addition amount of polyvinyl alcohol as a water soluble polymer was 0.94 g (0.05% by mass with respect to silver). The kneading by the rotary-and-revolutionary mixer caused a very high viscosity paste, and as a result of the kneading by the three-roll mill, the occurrence of flakes was confirmed during the kneading. The obtained silver powder had a large aggregation structure and is not easily broken, and therefore, had difficulties in being made into a paste. Since it was difficult to make the silver powder into a paste, $D_2/D_1$ and $\eta_2/\eta_1$ could not be evaluated.

Table 1 collectively shows the mean primary-particle diameter $D_S$, the specific surface area $SA_B$, the specific surface area ratio $SA_B/SA_S$, the degree of aggregation, the degree of aggregation after application of a load of 100 N/cm$^2$, and the compressibilities at the time of the application of loads of 34 N/cm$^2$ and 113 N/cm$^2$.

The results of Examples and Comparative Examples reveal that, compare with Comparative Examples 1 and 2, in Examples 1 to 4, a silver powder containing aggregates having a more appropriate strength was achieved and the silver powder allowed a paste having a more appropriate viscosity to be achieved, and excellent kneadability was attained. Hence, it is understood that, in Examples 1 to 4, no coarse flake occurred and a paste excellent in printability was achieved. Furthermore, in Examples 1 to 4, the formation of flakes was not caused at the time of making the silver powder into a paste, and hence it is understood that the silver powder is suitable for a resin-type silver paste and a baked-type silver paste which are applicable to fine-line wiring.

The invention claimed is:

1. A silver powder, having a specific surface area ratio $SA_B/SA_S$ of 0.5 to 0.9, wherein $SA_B$ is a specific surface area measured by a BET method and $SA_S$ is a specific surface area calculated from a mean primary-particle diameter $D_S$ measured with a scanning electron microscope, and having a degree of aggregation of 1.5 to 3.5, the degree being obtained in such a manner that a volume median diameter $D_{50}$ measured by laser diffraction scattering after application of a load of 100 N/cm$^2$ is divided by the foregoing Ds.

2. The silver powder according to claim 1, having a degree of aggregation of 1.5 to 5.0, the degree being obtained in such a manner that a volume median diameter $D_{50}$ measured by laser diffraction scattering before application of the load is divided by the foregoing Ds.

3. The silver powder according to claim 1, having a compressibility of not less than 20% caused by application of a load of 34 N/cm$^2$ in a measurement of a shear stress of a powder bed and having a compressibility of not more than 40% caused by application of a load of 113 N/cm$^2$.

4. The silver powder according to clam 1, having a ratio $D_2/D_1$ of from 0.5 to 1.5, wherein $D_1$ is a volume median diameter obtained in such a manner that the silver powder in a paste obtained by kneading of said silver powder with an epoxy resin at a centrifugal force of 420 G is measured by laser diffraction scattering; and $D_2$ is a volume median diameter obtained in such a manner that the paste is subse-

TABLE 1

|  | Example 1 | Example 2 | Example 3 | Example 4 | Comparative Example 1 | Comparative Example 2 |
|---|---|---|---|---|---|---|
| Mean primary-particle diameter $D_s$ (μm) | 1.0 | 1.0 | 0.9 | 1.1 | 0.9 | 1.1 |
| Specific surface area $SA_B$ (m$^2$/g) | 0.43 | 0.42 | 0.54 | 0.30 | 0.59 | 0.25 |
| Specific surface area ratio $SA_B/SA_S$ | 0.75 | 0.74 | 0.85 | 0.58 | 0.94 | 0.48 |
| Degree of aggregation (without load application) | 2.4 | 3.1 | 1.8 | 4.1 | 1.3 | 5.6 |
| Degree of aggregation after application of a load of 100 N/cm$^2$ | 2.1 | 2.8 | 1.5 | 3.4 | 1.2 | 4.5 |
| Compressibility at the time of application of a load of 34 N/cm$^2$ | 34 | 30 | 36 | 22 | 41 | 18 |
| Compressibility at the time of application of a load of 113 N/cm$^2$ | 39 | 37 | 40 | 26 | 52 | 25 |
| $D_2/D_1$ | 0.84 | 0.92 | 0.75 | 0.94 | — | — |
| $\eta_2/\eta_1$ | 0.65 | 0.82 | 0.55 | 0.88 | — | — | quently further kneaded using a three-roll mill, and the silver powder in said paste is measured by laser diffraction scattering.

5. The silver powder according to claim 1, having a ratio $\eta_2/\eta_1$ of from 0.5 to 1.5, wherein $\eta_1$ is a viscosity at a shear rate of 4 sec$^{-1}$, obtained in such a manner that a paste obtained by kneading of the silver powder with an epoxy resin at a centrifugal force of 420 G is measured using a viscoelastometer, and $\eta_2$ is a viscosity at a shear rate of 4 sec$^{-1}$, obtained in such a manner that the paste is subsequently further kneaded using a three-roll mill and measured.

6. The silver powder according to claim 1, wherein $SA_B/SA_S$ is 0.6 to 0.9.

* * * * *